United States Patent
Jessen et al.

(10) Patent No.: US 6,893,800 B2
(45) Date of Patent: May 17, 2005

(54) SUBSTRATE TOPOGRAPHY COMPENSATION AT MASK DESIGN: 3D OPC TOPOGRAPHY ANCHORED

(75) Inventors: Scott Jessen, Orlando, FL (US); John Martin McIntosh, Orlando, FL (US); Scott M. Nagel, Longwood, FL (US)

(73) Assignee: Agere Systems, Inc., Allentown, PA (US)

( * ) Notice: Subject to any disclaimer, the term of this patent is extended or adjusted under 35 U.S.C. 154(b) by 115 days.

(21) Appl. No.: 10/254,083

(22) Filed: Sep. 24, 2002

(65) Prior Publication Data

US 2004/0058255 A1 Mar. 25, 2004

(Under 37 CFR 1.47)

(51) Int. Cl.⁷ .............................................. G06F 19/00
(52) U.S. Cl. ........................ 430/311; 430/30; 430/396; 216/38; 716/19; 716/1
(58) Field of Search .......................... 430/311, 30, 396; 216/38; 716/19, 1

(56) References Cited

U.S. PATENT DOCUMENTS

| | | | |
|---|---|---|---|
| 5,655,110 A | 8/1997 | Krivokapic et al. | 716/19 |
| 5,879,866 A | 3/1999 | Starikov et al. | 430/395 |
| 5,994,009 A * | 11/1999 | Tzu et al. | 430/30 |
| 6,016,357 A | 1/2000 | Neary et al. | 382/144 |
| 6,033,814 A | 3/2000 | Burdorf et al. | 430/30 |
| 6,255,125 B1 | 7/2001 | Schmidt et al. | 438/14 |
| 6,309,809 B1 | 10/2001 | Starikov et al. | 430/395 |
| 6,309,947 B1 | 10/2001 | Bandyopadhyay et al. | 438/424 |
| 6,320,402 B1 | 11/2001 | Phan et al. | 324/765 |
| 6,322,934 B1 | 11/2001 | Cuthbert et al. | 430/5 |
| 6,343,370 B1 | 1/2002 | Taoka et al. | 716/21 |
| 6,440,644 B1 * | 8/2002 | Sato et al. | 430/322 |
| 6,552,812 B1 | 4/2003 | Xu et al. | |
| 2002/0058187 A1 | 5/2002 | Usui et al. | |
| 2003/0229412 A1 * | 12/2003 | White et al. | 700/121 |

FOREIGN PATENT DOCUMENTS

EP     1 256 846 A2    11/2002

* cited by examiner

*Primary Examiner*—John A. McPherson
*Assistant Examiner*—Daborah Chacko-Davis

(57) ABSTRACT

A semiconductor manufacturing method analyzes topography variations in three dimensions for each photolithographic level and determines critical dimension (CD) bias compensation as inputs to mask layout creation. Accurate predictions of topography variation for a specific mask design are made at the die level using known pattern density and CMP planarization length characteristics for a specific pattern. Exhaustive characterization of the photoresist response to de-focus and mask bias is determined by artificially expanding loss of CD through focus. Mask compensation to an expanded range of focus over all lines and spaces is maintained within the specification. 3D mask density data is obtained to determine the height component at each pixel location in the die. The resulting 3D OPC model is then utilized for mask creation.

5 Claims, 6 Drawing Sheets

KNOWN MASK STRUCTURE
POSITIONAL DENSITY

MODELED CMP RESPONSE TO MASK STRUCTURE, PLANARIZATION

PHOTORESIST PATTERNING ON TOPOGRAPHY

STEPPER SYSTEM OPTICS MODEL
BLOCK DIAGRAM

SUBSTRATE TOPOGRAPHY COMPENSATION AT MASK DESIGN: 3D OPC TOPOGRAPHY ANCHORED

FIELD OF THE INVENTION

This invention relates in general to the field of semiconductor manufacturing. More particularly, this invention relates to a method for selective photolithographic mask correction on a semiconductor wafer surface compensating for 3D topographic non-uniformity.

BACKGROUND OF THE INVENTION

Photolithography is one of the most frequently employed semiconductor wafer processing techniques used to manufacturer integrated circuits (IC's). Photolithography comprises a process for forming a pattern (i.e., via photographic transfer) of complex circuit diagrams onto a semiconductor wafer surface for etching. These patterns are defined on the wafer in a succession of exposure and processing steps to form a number of superimposed layers. Manufacturing processes for IC devices depend upon extremely accurate reproduction of these patterns onto the wafer surface.

During each photolithographic step, deviations are commonly introduced that distort the photomask image being transferred onto a wafer surface. These deviations depend on the characteristics of a pattern being transferred, topology of the wafer, and a variety of other processing parameters. Processing deviations adversely affect the performance of a semiconductor device. Deviations that affect dimensions and shapes of wafer features caused by light intensity in a particular vicinity of a wafer effecting the light intensity in neighboring vicinities are referred to as optical proximity effects. Various compensation methods for optical proximity effects have been developed in efforts to improve the image transfer process. One method known to those skilled at the art is optical proximity correction (OPC). OPC consists of selectively biasing mask patterns to compensate for a proximity effect that occurs in an optical image transfer process.

An example of an OPC process involves identifying gate regions in a design where shapes at these regions are sorted according to their geometric types. These design shapes share at least one side with a second design shape. Grouping of sorted design shapes is performed according to their widths. Grouped design shapes identified as gate regions are then biased based on the applicable OPC. Commercial OPC software is available and used to obtain a corrected pattern through theoretical image correction on plain wafers. However, this software is not effective for wafer topography correction or other process-induced critical dimension (CD) variations.

Additional problems that cause optical proximity effects on the surface of a wafer are the topography of the wafer surface formed after the deposition of a polysilicon and an anti-reflectance coating layer. As device sizes shrink, the wavelength of light used in photolithography is decreased and numerical apertures of lenses are increased, leading to a reduced depth of focus. The depth of focus represents the relationship of a wafer surface being exposed to a stepper. Most of the depth of focus available is consumed by topography variations for non-planar substrates. Topography variations exist even after a planarization process, such as chemical mechanical polishing (CMP), has been performed to flatten a wafer surface. Lack of planarity on the overlying surfaces can degrade the semiconductor device quality making the depth of focus a critical processing parameter. If the surface is not planar, it is impossible to have the whole surface exposed while in proper focus. Therefore, a trade-off between the maximum achievable resolution and the usable depth of focus in a photolithographic process has to be made. The usable depth of focus determines the overall performance of the photolithographic process. In the case where an image needs to be reproduced on a given topography, the usable depth of focus can be a more significant factor than the achievable resolution. Thus, there exists a need in the art for a 3D OPC model method that links a deterministically predicted topography map (pattern density) to a measured CD (i.e., scale) in the photolithographic process to overcome these limitations.

SUMMARY OF THE INVENTION

Among the several objects of the present invention may be noted streamlining the semiconductor manufacturing processes, increasing product yield rates, solving the need for greater precision, improving process precision by means compensating for surface topography at mask design and providing a method for optical proximity correction of a mask before it is created via a software simulation that predicts how to bias a particular mask utilizing known 3D surface map data.

Processing for the method disclosed creates 3D OPC models that link deterministically predicted topography maps (i.e., pattern density) to measured CD (or scale) responses of the photoresist system. Accurate predictions of topography variation for a specific mask design are made at the die level by utilizing pattern density and CMP planarization length. Characterization of the photoresist response to de-focus and mask bias is determined to enable effectively reducing requirements for the stepper and photoresist depth of focus by artificially expanding loss of CD through focus. Mask compensation to an expanded range of focus over all lines and spaces is maintained within the specification range by utilizing information on the effective focus change caused by topography variation at the die level. 3D mask density data is used to determine the height component at each pixel location in the die. The outputted 3D OPC model is utilized for mask creation.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

Semiconductor manufacturing includes a number of crucial processes performed on wafer lots, one of which is photolithography. As semiconductive materials are staged through these processes, it is essential to accurately perform photolithography since it determines device dimensions directly effecting quality, production yield, and manufacturing cost. Photolithography is also a critical process because it is iterated in a succession of exposure/processing steps to form a number of superimposed layers of insulators, conductors, and semiconductor materials.

Photolithographic processing occurs on a plurality or "lot" of wafers, which are fabricated as a batch. A representative photolithographic processing includes the following steps:

Each wafer has material patterned on its surface using a photoresist patterning process (i.e., each wafer is coated with photoresist), Wafers are exposed to an energy source such as an ultraviolet light with a mask exposed onto the photoresist creating a desired pattern on the photoresist, Photoresist is developed by applying a developer solution, Patterns (i.e., images) are stabilized by an appropriate lithography or fixing method, and Each wafer is etched.

Figure 1A:
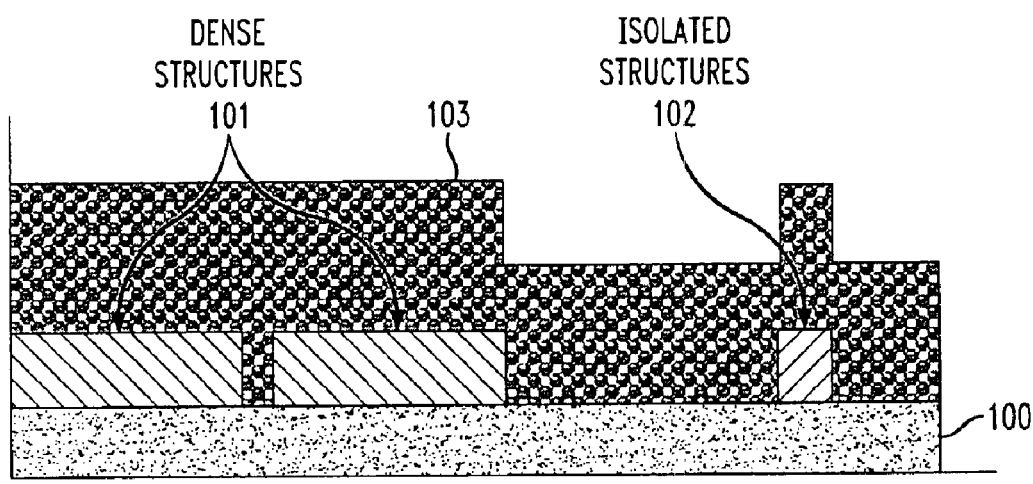
FIG. 1a is a diagram depicting the known mask structure based on positional density of patterns.
Figure 1A:

During photolithographic processing, deviations may be introduced that distort a photomask image that is being transferred to a wafer surface (e.g., images formed on a wafer surface deviate from the original dimension and shape of a photomask image). Some of these deviations depend on known characteristics of the pattern and substrate topography as indicated in FIG. 1a. Examination of a wafer after a chemical vapor deposition (CVD) process has been performed often reveals severe variances in the wafer surface. The positional density of patterned structures 101, 102 influences the resultant surface 103 height variances. Dense structures 101 at the pattern level in relatively close proximity results in a broader surface mound than the existence of isolated structures 102. Where structures are not present, the surface is relatively recessed.

After the CVD process is performed, the wafer is subjected to a chemical mechanical polishing (CMP) process to flatten the surface. The CMP process applies a load force to a wafer while it rests on a pad. Both the pad and wafer are then counter rotated while slurry containing both abrasives and reactive chemicals is passed over the surface. Planarization properties that result from CMP for the patterned structure shown in FIG. 1a are portrayed in FIG. 1b. Note the topographic variation even after planarization processing (i.e., there is a height variation across the CMP processed surface). The CMP processed surface height in proximity of an isolated feature 102 is shorter than the height in the proximity of the dense feature pattern 101. The surface mound is also broader over dense pattern structures than isolated structures. Again, areas where no patterned features exist are relatively recessed. Therefore, the CMP planarization process may only optimize uniformity across similar density areas within a die. The resulting difference in height between known dense structure proximity and the proximity where no patterned structures exists yields a predictable topography variation.

Figure 1B:
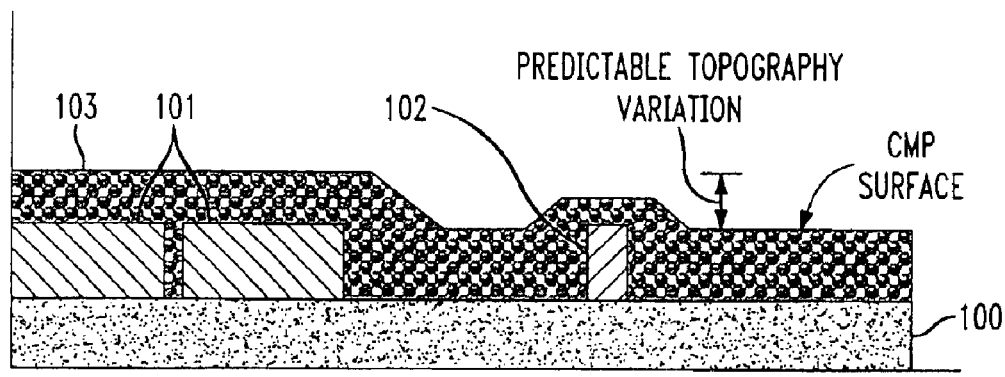
FIG. 1b is a planarization diagram indicating the modeled CMP response to mask structure.
Figure 1C:
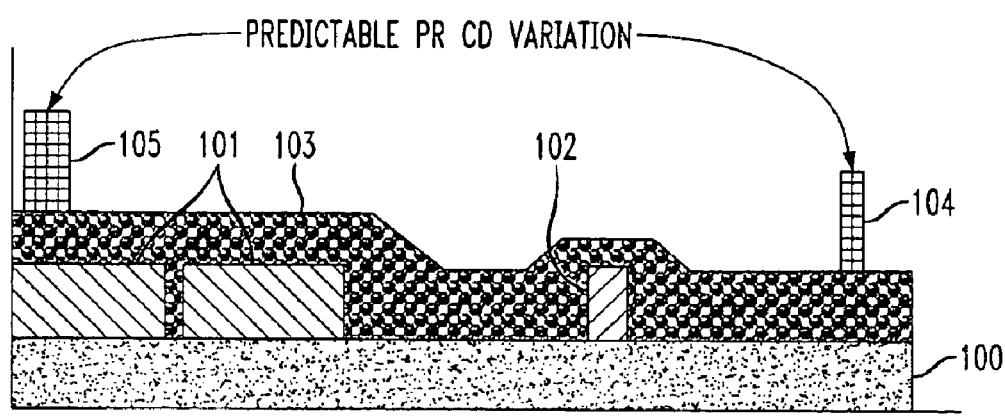
FIG. 1c is a representation of photoresist patterning on substrate topography.

These topography variations perpetuate onto photoresist patterning 104, 105 as shown in FIG. 1c. This variation is predictable and dependent on the pattern density as shown. A predictable CMP surface topography variation exists between the proximity where none or limited patterned features are present and the proximity of dense patterned features. When a conducting line is formed on a wafer surface, which has a thin oxide-coating layer at certain sections and thick field oxide layers at other sections, the width the conducting line forms is different at these locations (i.e., on top of the thin oxide region or the thick field oxide regions).

Figure 2:
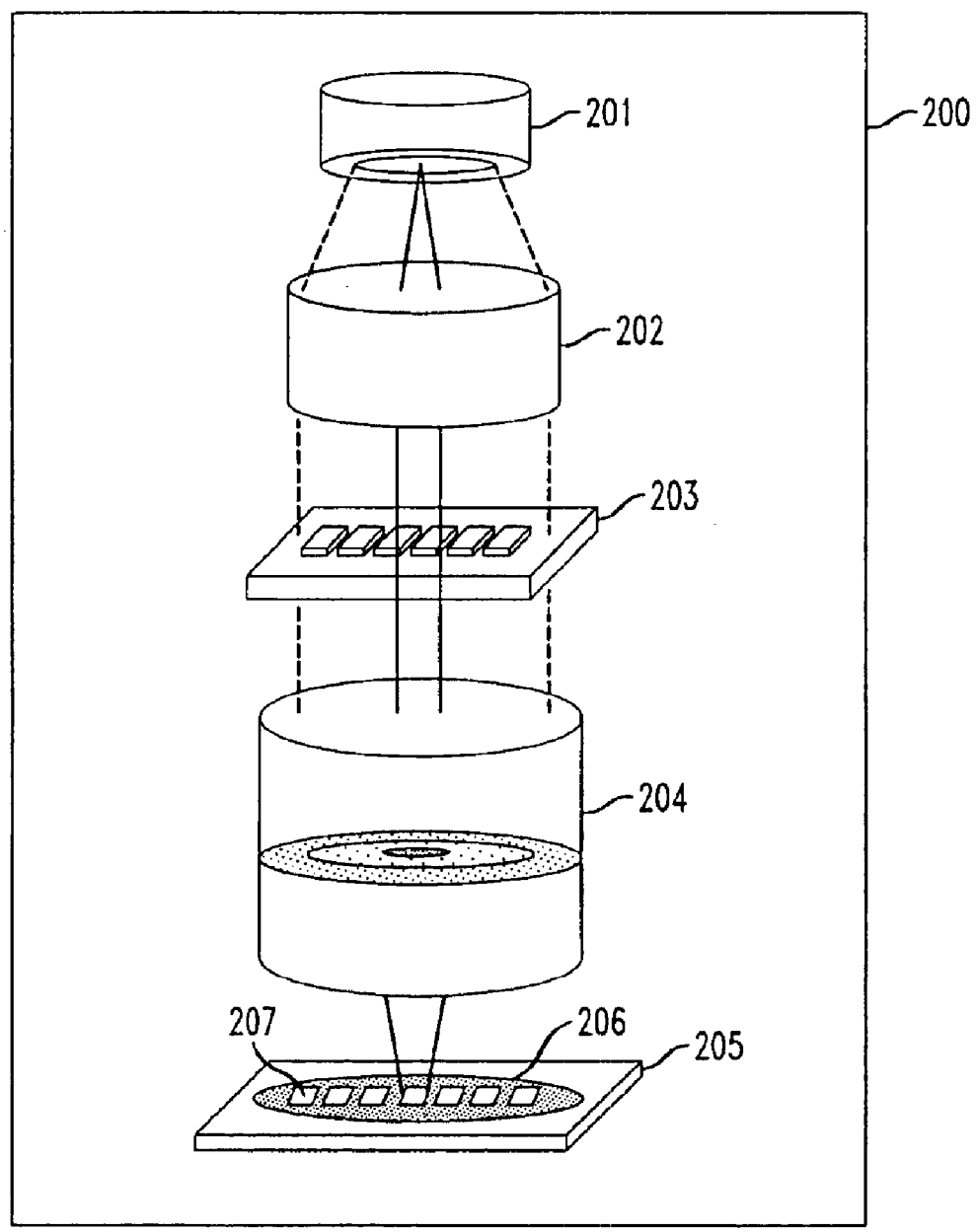
FIG. 2 is block diagram representation of key elements in a stepper system.

Photolithography uses a stepper system 200 to transfer a mask pattern onto a wafer as represented in FIG. 2. The stepper system 200 refractive optics projects a mask image onto the photoresist layer of a wafer 208. The stepper system 200 includes an effective light source with an aperture 201, a condenser lens system 202, the mask 203, a projection lens system 204, and a wafer stage 205 where an individual die 207 on the wafer 206 being processed is exposed. The stepper machine sequentially processes one or more dies 207 at a time on the wafer 206 until all dies are exposed. Light exposure may be limited to specified wavelengths via filtering. The condenser system 202 focuses light energy through the mask 203, which is reduced via the projection lens system 204. The reduced mask is then projected onto an exposed wafer die.

Accuracy is of the utmost importance when determining a pattern to place on a mask. For example, the slowest transistor will often limit devices such as a microprocessor formed on the semiconductor wafer. The speed of a transistor can vary significantly as a result of line width variations. Therefore, it is desirable to know in advance how various processing steps will affect the line width formed at various locations in the stepper field so that such variations can be accounted for appropriately.

One factor affecting accuracy is depth of focus which is related to the distance between stepper system optics and the substrate being exposed. The depth of focus has two primary components of limitation. The first limitation is profile change where the shape of the patterned photoresist is changed at the extreme positive and negative boundaries of focus. However, this shape change is usually not the primary limitation. The second limitation, which has greater impact, is when the scale or CD of a patterned photoresist exceeds specification. Most of the depth of focus available is typically consumed by these topography variations. As shown in FIG. 1b, topography variations exist even after planarization processing. Since the usable depth of focus determines overall performance of the photolithographic process, a trade-off between the usable depth of focus and maximum achievable resolution has to be determined.

Figure 3:
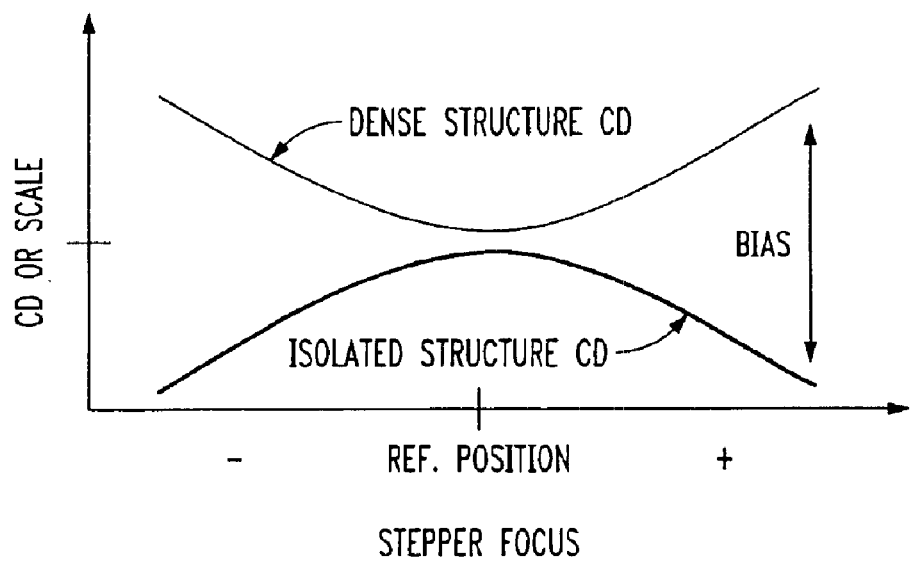
FIG. 3 is a comparison of dense structure CD verses isolated structure CD biasing relative to stepper focus from a reference position.

FIG. 3 depicts the relationship between a wafer surface CD or scale relative to the stepper focus position. Stepper focus is the stepper system 200 focal setting relative to a substrate position. Adjusting the stepper focus above or below the reference position (i.e., positive or negative positioning relative to the reference position) yields a different response. The CD or scale bias of the wafer topology relative to the stepper focus position also depends on pattern density. If the stepper focus is over a dense structure (e.g., an area where dense lines exist), the CD or scale bias values increase as the stepper focus moves away from a reference position. However, if the wafer surface is over an isolated structure (e.g., an area where a single line exists), the CD or scale bias values decrease as the stepper focus is moved away from its reference position.

Figure 4:
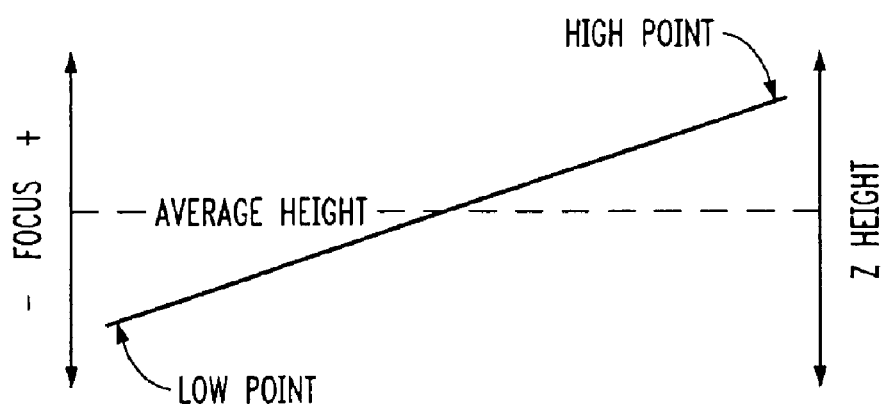
FIG. 4 depicts the topography equivalent focus.

CMP planarization length indicates the extent to which a CMP process flattens the topography. The larger the planarization length, the better the planarization capability resulting in a more uniform topology across different densities within a die. The topography results of prior level processing anchored by measurements of planarization length can be predicted by determining field of focus positions at the minimum and maximum topography range. This aids in choosing an optimized processing focus. FIG. 4 shows the correlation of the topography or height variations around the reference focus positions that result in the equivalent of a focus variation equal to the deviation of the local position from the reference height, z. A different response is obtained as the stepper focus is varied.

The dimension of features will change with focus. Even more importantly, the dimension change depends on the pitch of lines (the range between dense and isolated structures). End of line dimensional changes also depend on focus. A pillar or chain are examples of structures sensitive to end of line changes caused by focus variations. Determining the positions on a field that are at minimum and maximum topography range permits the selection of the appropriate processing focus.

Figure 5:
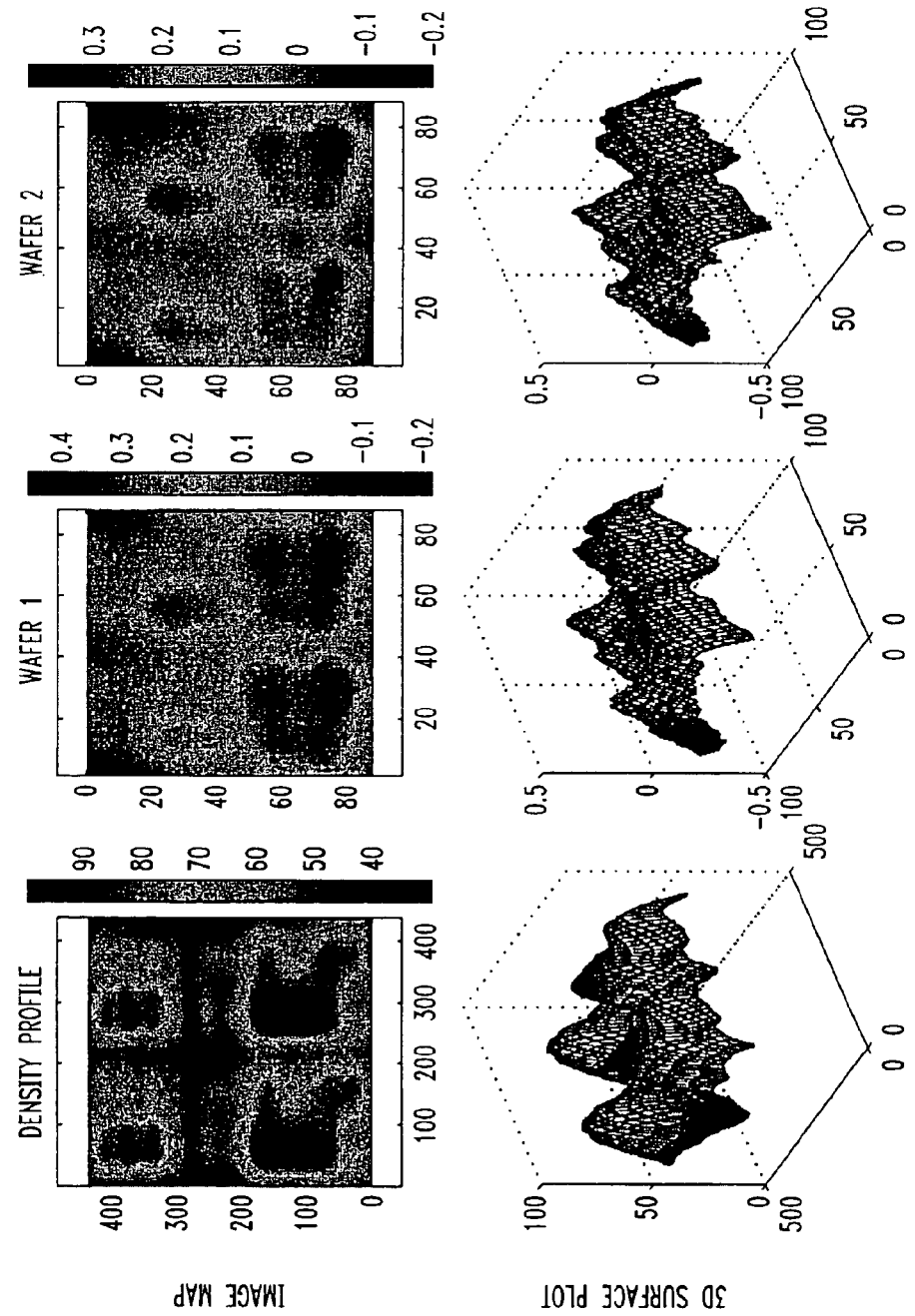
FIG. 5 is provides image maps and their corresponding 3D surface plots of the CMP topography model.

FIG. 5 provides an aerial image map of a particular density profile. Below the density profile is a corresponding 3D surface plot. From examination of this data, which has been replicated for two other wafers using the same density profile, it is deduced that there is a very good correspondence between the surface map and surface plot despite different sampling rates and measurement windows that were used. The present invention leverages this 3D surface plot data to obtain the z value for each x,y location in the die image.

Figure 6:
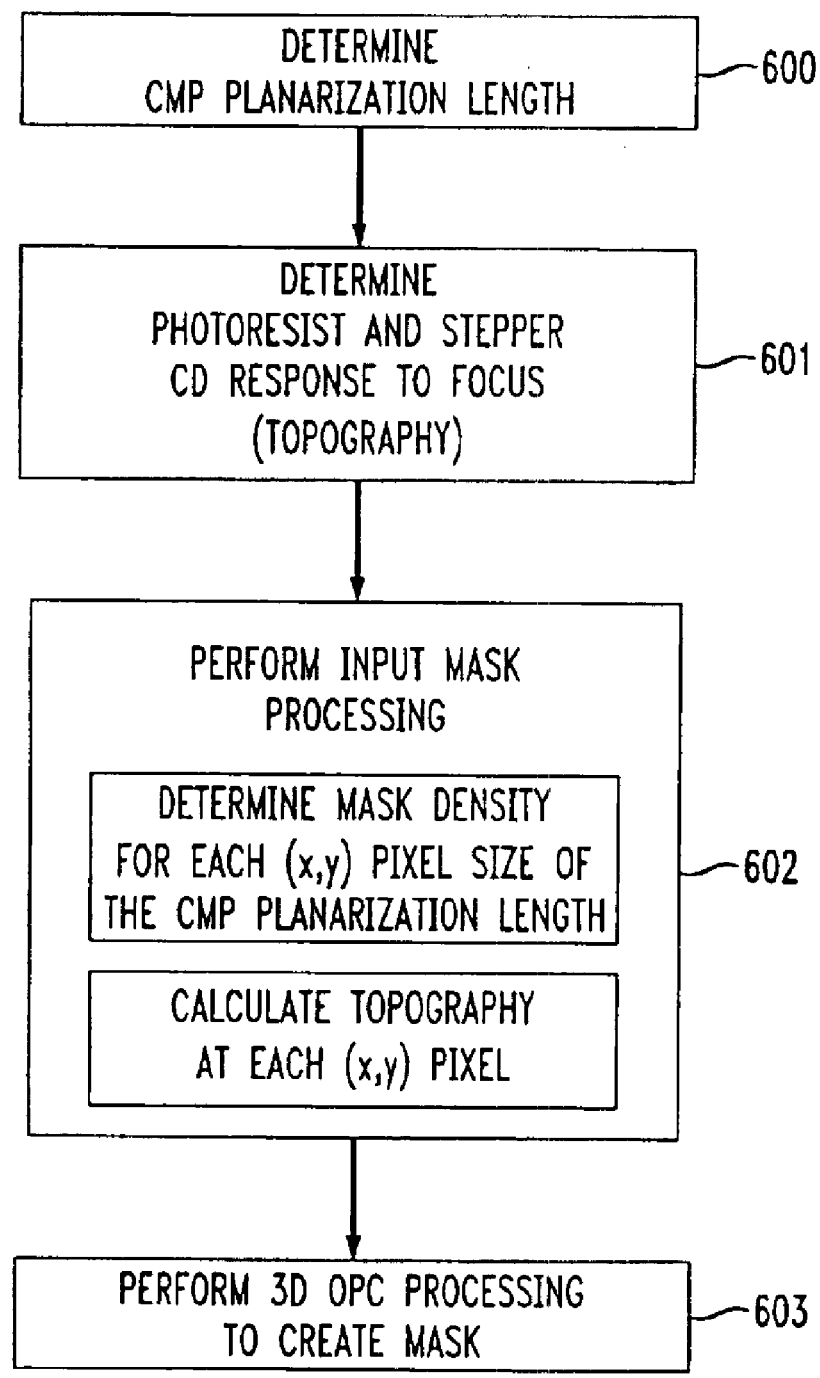
FIG. 6 is a top-level process flow diagram for the present invention.

Processing for the method disclosed creates 3D OPC model that links the deterministically predicted topography map (i.e., pattern density) to the measured CD (or Scale) response of the photoresist system to that topography. Process Flow of FIG. 6 begins by characterizing the physical process using predictions that are deduced relative to the pattern density. This includes assessing the CMP surface (i.e., pattern density) to establish the planarization length for the process, block 600. Then the optimum photoresist and stepper CD response to focus is determined, block 601, based on these predictions. The stepper focus is correlated to topology of the die or z height as described in FIG. 4. For input mask processing, block 602, the mask density for each x,y location at a pixel size of the CMP planarization length is calculated using the 3D topography (i.e., z height for each pixel). These CD bias values are then used to compensate for topology undulations (i.e., provided as inputs for 3D OPC), block 603, creating a mask that accurately reflects characteristics of a given pattern. Using this accurate compensation method for actual topography variations effectively increases the process margin.

While only certain preferred features of the invention have been shown by way of illustration, many modifications and changes will occur to those skilled in the art. It is, therefore, to be understood that the present claims are intended to cover all such modifications and changes, which fall within the true spirit of the invention.

What is claimed is:

1. In a semiconductor manufacturing process having a stepper system for transferring a mask pattern onto a semiconductor wafer surface using an optical projection system, a method of compensating for topographic variations due to feature density on the wafer surface comprising:

determining feature pattern density by location on the wafer surface;

determining planarization length as a function of pattern density;

computing feature elevation as a function of pattern density on the wafer surface; and adjusting focus of the stepper system to minimize out-of-focus exposure at high and low elevation features on the wafer surface.

2. The method of claim 1 wherein setting of photolithographic characteristics comprises selecting photoresist and stepper response settings.

3. The method of claim 1 and including calculating mask density at a pixel size using feature height for each pixel.

4. The method of claim 3 and including using the calculated mask density as bias values for optical proximity correction.

5. The method of claim 1 and including obtaining a density profile of a processed semiconductor, correlating the density profile to 3D surface characteristics, and using the 3D surface characteristics to determine feature height on the semiconductor surface.

* * * * *